(12) United States Patent
Pace

(10) Patent No.: US 8,378,719 B1
(45) Date of Patent: Feb. 19, 2013

(54) PROGRAMMABLE HIGH-SPEED FREQUENCY DIVIDER

(75) Inventor: Ferdinando Pace, Birmensdorf (CH)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/276,136

(22) Filed: Oct. 18, 2011

(51) Int. Cl.
*H03K 21/00* (2006.01)

(52) U.S. Cl. ........................................ 327/115; 327/117

(58) Field of Classification Search .................. 327/115, 327/117, 254, 255
See application file for complete search history.

(56) References Cited

U.S. PATENT DOCUMENTS

| | | | |
|---|---|---|---|
| 5,754,615 A | 5/1998 | Colavin | |
| 6,163,181 A * | 12/2000 | Nishiyama | 327/115 |
| 6,834,094 B1 * | 12/2004 | Liu et al. | 377/47 |
| 6,961,403 B1 | 11/2005 | Austin et al. | |
| 6,970,025 B2 | 11/2005 | Magoon et al. | |
| 7,042,257 B2 * | 5/2006 | Wang | 327/115 |
| 7,760,843 B2 * | 7/2010 | Boerstler et al. | 377/47 |

* cited by examiner

*Primary Examiner* — Hai L Nguyen
(74) *Attorney, Agent, or Firm* — Howison & Arnott, L.L.P.

(57) ABSTRACT

A programmable high-speed frequency divider architecture is provided to provide a substantially 50% duty cycle signal output regardless of whether the division ratio is odd or even. The programmable frequency divider circuit receives an input clock signal having a first period and outputs and output clock signal that has a second clock signal period that is a programmable multiple, A, of the first period. The frequency divider includes a shift register that receives the input clock signal and produces a first output signal. The frequency divider also includes a duty cycle compensation circuit that accepts the first output signal and produces an output clock signal that has a duty cycle that is substantially 50%.

17 Claims, 8 Drawing Sheets

PROGRAMMABLE HIGH-SPEED FREQUENCY DIVIDER

TECHNICAL FIELD

Embodiments of the invention relate to a programmable frequency divider.

BACKGROUND

Some modern transceiver circuitry used in, for example, mobile communication devices, requires clock signals of various frequencies from frequency division circuitry. For example, in the receiver portion of a transceiver, a local oscillator (LO) frequency is typically a division of a given reference frequency. A programmable frequency divider is often included in phase locked loop (PLL) circuits to generate a desired LO frequency. In the transmitter portion of the transceiver, a programmable frequency divider is typically included in transmission loops to help generate a necessary radio frequency (RF) or intermediate frequency (IF).

Referring to FIG. 1, a basic block diagram of a frequency divider 100 is provided. A clock-in signal 102 is input into the frequency divider 100. The DIV input 104 represents a desired division ratio. DIV is sometimes an array or vector of N+1 bits for indicating the division ratio. For example, to represent a division ratio ranging from 1-8, an array of 3 or more bits could be used. The load signal 106 is a signal used to load a state in the frequency divider 100 such that the proper division ratio of the clock-in signal 102 will be performed. The clock-out signal 108 is the resultant divided down output signal.

FIG. 2 is a block diagram of a prior art frequency divider 200. The core of this frequency divider is a counter 202, which counts according to the division ratio set by the DIV input 204. The counter 202 counts the clock cycles of the clock input 206 to enable generation of a count waveform 208 that has a frequency equal to the frequency of the clock input 206 divided by the division ratio represented by DIV 204. The additional logic 210 handles both odd and even division ratio inputs. Negative edges of the clock input 206 can be used in the processing of odd division ratios and thereby provide a balanced 50/50 duty cycle clock output 212. If the division ratio, DIV 204 is "large", for example between 4 and 1024, then the increased complexity of the counter block 202 creates a substantial design limitation on the allowable maximum clock-in frequency 206. This is due to the logic in the counter 202 becoming more complex as the DIV number becomes larger thereby having a consequence of creating a critical delay time for the timing of the counter circuitry 202 to creation of the clock-out signal 212 with respect to the clock-in signal 206. It has been shown through computer analysis that when using CMOS040 technology (CMOS-40 nm technology) the maximum frequency for the clock-in signal 206 is about 910 MHz when N equals 3 (i.e., N+1=4 bits) and the division ratio input 204 has a value ranging from 1 to 16. Creating high frequency division circuits using prior art counter-style frequency divider cannot physically operate at frequencies over about 910 MHz and operate with a division ratio greater than 16 using CMOS-40 nm technology.

Thus, a problem that needs to be addressed is to resolve how to minimize the critical timing delay at a frequency divider circuit when the DIV or division ratio 204 is a large number (i.e., represented as a division ratio between 4 and 1024). For example, if a clock-in signal 206 is 910 MHz (which is less than one GHz) and N=3, then this prior art frequency divider will work properly. But, for example, if N=5 or more then the frequency division of this prior art frequency divider 200 becomes impossible because there is not enough set-up time for the flip-flop devices within the counter block 202 to operate correctly. Therefore, what is needed is a frequency division design that allows for programmable frequency division of a clock input such that whatever number is selected as the division ratio, substantially the same performance of the division aspect of the frequency division circuitry is provided regardless of how complex or large the division circuit becomes. Further, it would be advantageous to be able to provide a frequency divider device wherein the DIV (the division ratio) can be increased without limiting the maximum clock-in frequency.

Additionally, it would be advantageous to provide such a high speed clock frequency divider architecture that can provide the 50% duty cycle clock-output regardless of whether the division ratio is an odd or even positive integer.

SUMMARY

Embodiments of the present invention are directed toward a programmable frequency divider circuit or architecture capable of providing a clock-output having a 50% duty cycle regardless of whether the selected division ratio is odd or even. Furthermore embodiments of the invention provide a programmable frequency divider wherein the programmable frequency divider operates at substantially the same performance level when clocked at up to a maximum clock-in signal frequency of between about 1 to 2 GHz and the frequency division ratio is selected as any positive whole number between 2 and, for example, 1024. As such, embodiments of the invention provide a novel architecture for a programmable high-speed digital divider that can divide the frequency of a clock signal that is considered a high frequency (greater than 1 GHz) to a frequency needed by the circuitry technology used in the device technology (such as CMOS040 or faster technology). Additionally, embodiments of the invention allow for the frequency division ratio to be changed from a low division ratio, such as 2, to a large division ration, such as 1024, without affecting the maximum frequency that can be used for the clock-in frequency.

An embodiment of the invention provides a frequency divider circuit that is adapted to receive an input clock signal that has a first period and produces an output clock signal having a second period that is a programmable multiple, A, of the first period. The exemplary frequency divider circuit comprises a shift register circuit that is adapted to receive the input clock signal. The shift register circuit also provides a first output signal. The embodiment has a duty cycle compensation circuit that is configured to receive the first output signal. The duty cycle compensation circuit comprises a first delay circuit that is configured to provide a second output signal. The second output signal has substantially constant amplitude when the multiple A is even. The second output signal corresponds to the first output signal delayed by a first delay when the multiple A is odd. The embodiment has a second delay circuit configured to provide a third output signal. The third output signal corresponds to the first output signal delayed by a second delay that is substantially one-half an input clock signal cycle less than the first delay. Also, the embodiment comprises an OR circuit that has a first input adapted to receive the second output signal and a second input adapted to receive the third output signal. The OR circuit provides the output clock signal as a result performing an OR function on the second and third output signals.

An embodiment may further comprise a shift register circuit that is configured to comprise a set of shift register stages {S_i} connected in series. Each stage S_i of the shift register stages comprises a stage multiplexer M_i and a stage flip-flop F_i. An output MO_i of each stage multiplexer is coupled to an input FI_i of the corresponding stage flip-flop F_i An output FO_i of each stage flip-flop F_i coupled to a first input MI_i–1 of a stage multiplexer M_i–1 in an immediately following stage S_i–1. The output FO_1 of flip-flop F_1 in stage S_1 of the shift register is coupled to a second input MI2_i of each stage multiplexer M_i. Also, each stage flip-flop F_i is configured to be clocked and positive edge triggered by the input clock signal such that the output FO_1 of flip-flop F_1 in stage S_1 of the shift register is the first output signal.

An embodiment of an exemplary frequency divider circuit may also have each stage multiplexer M_i coupled to a control circuit. Each stage multiplexer M_i is adapted to receive from the control circuit a selection signal S[i] for selecting between the stage multiplexer output signal MO_i corresponding to the first stage multiplexer input signal MI1_i or the previous States, S_i–1, flip-flop output signal, FFO_i–1 corresponding to the multiplexer input signal MI2_i. The selection signal S[i] depends on the multiple A.

Additional embodiments may further have each stage multiplexer M_i coupled to a control circuit, wherein each stage multiplexer M_i is adapted to receive a load signal for loading the stage multiplexer M_i with a reset value L[i]. The load signal L[i] depends on the multiple A.

In embodiments of the frequency divider circuit, the shift register circuit is configured to provide the first output signal with a duty cycle that is substantially 50% when the multiple A is even.

In some embodiments, the frequency divider circuit's first delay circuit comprises a first delay circuit flip-flop that is clocked by the input clock signal and changes its output value on a negative edge of the input clock signal. An input of the first delay circuit flip-flop is coupled to the first output signal. The first delay circuit further comprises a delay circuit multiplexer that comprises a first input of the delay circuit multiplexer coupled to an output of the first delay circuit flip-flop. A second input of the delay circuit multiplexer is coupled to receive a signal having a substantially constant amplitude. The delay circuit multiplexer is configured to receive a selection signal from the control circuit (or other signal source) for selecting between an output signal of the delay circuit multiplexer corresponding to (a) the first input of the delay circuit multiplexer or (b) the second input of the delay circuit multiplexer. The selection signal depends on whether the multiple A is even or odd. A second delay circuit flip-flop, which is clocked by the input clock signal and which changes its output value on a negative edge of the input clock signal, receives an input signal that is the output signal of the delay circuit multiplexer. The output of the second first delay circuit flip-flop provides the second output signal.

In various embodiments of the invention, when the multiple value A is even, the reset value of stages S_(A/2) to S_(1) are loaded with signals corresponding to the logical value 0, the reset value of stages S_(A/2)+1 to S_A are loaded with signals corresponding to logical value 1. Additionally, when the multiple value A is odd, the reset value of stages S_(trunc (A/2)+1) to S_(1) are loaded with signals corresponding to logical value 0, the reset value of stages S_(trunc(A/2)+2) to S_(A) are loaded with signals corresponding to logical value 1, and the selection signal S[i] of stage S_i selects the second input MI2_i for i=M_A and selects the first input MI1_i for i=M_A–1, . . . , M_1.

Some embodiments of the frequency divider circuit require that the second delay is provided at least in part by a positive edge triggered flip-flop.

Some embodiments of the invention include a mobile communication device or unit that comprises an exemplary frequency divider circuit as an intricate and important part of the mobile communication device circuitry.

Another embodiment of the invention provides a method for frequency dividing an input clock signal that has a first cycle period in order to provide an output clock signal having a second cycle period that is a programmable multiple, A, of the first cycle period. An exemplary method comprises the steps of receiving, by a shift register circuit, the input clock signal and producing a first output signal. Receiving, by a duty cycle compensation circuit, the first output signal. Producing, by the duty cycle compensation circuit, a second output signal that has a substantially constant amplitude when the multiple A is even, produces a second output signal that corresponds to the first output signal delayed by a first delay when the multiple A is odd. The method further produces, by the duty cycle compensation circuit, a third output signal corresponding to the first output signal delayed by a second delay that is substantially one-half an input clock signal cycle period less than the first delay. Finally, the method logically ORs the second output signal with the third output signal to produce the output clock signal.

In exemplary methods a duty cycle of the first output signal is 50% when the multiple A is even.

Exemplary methods wherein the duty cycle compensation circuit comprises a first delay that includes a first delay circuit flip-flop, a delay circuit multiplexer, and a second delay circuit flip-flop, comprise the steps of: Receiving, by a first delay circuit flip-flop, the first output signal; Clocking the first delay circuit flip-flop with the input clock signal and changing a first delay circuit flip-flop output value on a negative edge of the input clock signal; Providing the first delay circuit flip-flop output to a first input of a delay circuit multiplexer; Providing a signal having a substantially constant amplitude to a second input of the delay circuit multiplexer; Providing a selection signal to the delay circuit multiplexer, which is adapted to produce a delay circuit multiplexer output corresponding to (a) the first delay circuit flip flop input or (b) the substantially constant amplitude, wherein delay circuit multiplexer output depends on whether the multiple A is even or odd; And further comprise the steps of: Receiving, by the second delay circuit flip-flop, the delay circuit multiplexer output; And, clocking the second delay circuit flip-flop with the input clock signal and changing a second delay circuit flip-flop output value on the negative edge of the input clock signal to provide the second output signal.

In exemplary methods, wherein the duty cycle compensation circuit comprises a second delay circuit comprising a third delay circuit flip-flop, the method further comprises: Receiving the first output signal at an input of the third delay circuit flip-flop and triggering a third delay circuit flip-flop output on a positive edge of the input clock signal, wherein the third delay circuit flip-flop output is the same as the third output signal.

Additional embodiments of an exemplary programmable frequency divider circuit comprise a ring shift register adapted to be initialized with a bit pattern and an effective ring length, the ring shift register is further adapted to receive an input clock signal having a first clock frequency such that the ring shift register shifts the bit pattern through the ring shift register at the first clock frequency and such that the bit pattern repeats at a second frequency to produce a ring shift register output signal having the second clock frequency. This embodiment further includes a control block adapted to initialize the shift sequence bit pattern and the effective ring length of the ring shift register upon receipt of a division ratio signal. A duty cycle correction block that is adapted to produce a frequency divider output clock signal at the second frequency is provided. The frequency divider output clock signal obtains a balanced duty cycle by logically ORing a first delayed ring shift register output signal and a clock-N signal, wherein the clock-N signal is held at a first state when the second frequency is an even division ratio of the first frequency; or by logically ORing the first delayed ring shift register output and the clock-N signal, wherein the clock-N signal corresponds to a second delayed ring shift register output signal when the second frequency is an odd division ratio of the first frequency.

In yet another embodiment of the programmable frequency divider circuit, the first delayed ring shift register output is delayed by a predetermined amount and the second delayed ring shift register is delayed by one-half clock cycle of the first clock frequency more than the first delayed ring shift register output when the second frequency is and odd division ratio of the first frequency.

Yet another embodiment provides a frequency divider for dividing a clock signal having a first frequency into an output signal having a second frequency with a balanced duty cycle, the frequency divider comprising an input to receive the clock signal; a programmable ring shift register that selectively divides the clock signal by an even division ratio or an odd division ratio in order to provide a shift register output signal. The embodiment further includes a duty cycle adjustment circuit that receives the clock signal and the shift register output signal. The duty cycle adjustment circuit comprises a first flip-flop that receives the clock signal, a first D input that receives the shift register output signal and a first Q output. A first plurality of flip-flops coupled in series and in parallel with the first flip-flop; each flip-flop of the plurality of flip-flops is clocked on an inverted clock signal. The first plurality of flip-flops is adapted to selectively provide a second Q output such that when the programmable ring shift register is set to divide the clock signal by an even division ratio, the second Q output remains at a first state. The first plurality of flip-flops is further adapted to selectively provide a second Q output such that when the programmable ring shift register is set to divide the clock signal by an odd division ratio, the second Q output is adapted to provide a shifted first stage output signal. An OR element is connected to logically OR the first Q output and the second Q output to produce an output signal having the second frequency and the balanced duty cycle.

Embodiments may further include a frequency divider, wherein the programmable ring shift register comprises a second plurality of flip-flops coupled in series. Each of the second plurality of flip-flops receives a clock signal. The second plurality of flip-flops are operatively arranged to form a ring of flip-flops that can circulate, through the ring, a shift sequence bit pattern that repeats at the shift register output at the second frequency. Such an embodiment also includes a plurality of MUXs, connected such that each MUX can receive one input from a Q-output of a previous flip-flop and another input from the shift register output signal. Furthermore, each MUX is adapted to provide an output to a D-input of the next flip-flop of the plurality of flip-flops in accordance with a previously loaded MUX decode bit.

Various embodiments can be programmed for different division ratios by loading a shift sequence bit pattern into the flip-flops of the programmable ring shift register such that when an even division ratio is required, the shift sequence bit pattern comprises M sequential bits having a first state and M sequential bits having second state, wherein M is a positive non-zero integer. Furthermore, when an odd division ratio is required, the shift sequence bit pattern comprises M sequential bits having a first state and M+1 sequential bits having a second state, wherein M is a positive non-zero integer.

In some embodiments, the second Q output within the duty cycle adjustment circuit is shifted by substantially 1.5 clock cycles of the clock signal.

Other embodiments of the invention provide a programmable frequency divider circuit that has a ring shift register adapted to be initialized with a bit pattern and an effective ring length. The ring shift register receives a clock signal having a first frequency so that the ring shift register shifts a shift sequence bit pattern through the ring shift register at the first frequency such that the shift sequence bit pattern repeats at a second frequency at a ring shift register output. An initialization block is used to initialize the shift sequence bit pattern and the effective ring length in the ring shift register upon receipt of a division ratio signal and, in some embodiments, an enable signal. In some embodiments, the enable signal enables the ring shift register to be configured according to the division ratio signal. Also, a duty cycle correction block is used to logically OR the ring shift register output and a bit in a first state when the second frequency is an even division ratio of the first frequency. Alternatively, the duty cycle correction block will logically OR the ring shift register output and a delayed representation of the ring shift register output, thereby producing a balanced duty cycle output at the second frequency. The ring shift register output being shifted by 0.5 clock cycles of the first clock signal with respect to the delayed representation of the ring shift register output.

An embodiment of a programmable frequency divider circuit may also include a first flip-flop circuit adapted to recreate the ring shift register output, such that the recreated ring shift register output is substantially equal to the ring shift register output, but is delayed by one clock cycle of the clock signal. The second flip-flop circuit also creates a signal similar to the ring shift register output, such that the similar signal is substantially equal to the ring shift register output, but is delayed by 1.5 clock cycles of the clock signal. Further, a logical OR circuit is connected to logically OR the recreated ring shift register output with the copy of the of the ring shift register output and to output the balanced duty cycle output at the second frequency.

Embodiments of the programmable frequency divider circuit include a frequency divider circuit that is adapted to be programmed to divide the first frequency of the clock signal by an even division ratio. In order to do so, the shift sequence bit pattern that is loaded into the plurality of flip-flops in the ring shift register comprise a number of sequential bits in a first state and a same number of sequential bits in a second state. When the frequency divider circuit is programmed to divide the first frequency of the clock signal by an odd division ratio, the shift sequence bit pattern comprises a first number (M) of sequential bits in the first state and a second number (M+1) of sequential bits of the second state, wherein M is a positive non-zero integer.

Additionally, embodiments of the invention provide a method of dividing a frequency of a clock signal by either an even division ratio or an odd division ratio to generate an output clock signal. An exemplary method comprises the steps of forming a ring of flip-flops connected in series and comprising a ring shift register output; initializing a plurality of the flip-flops in the ring of flip-flops such that; when an even division ratio of the clock frequency is selected, then initializing a first half of the plurality of flip-flops with a shift sequence of bits having a first state and initializing a second half of the plurality of flip-flops with a shift sequence of bits having a second state; and when an odd division ration of the clock frequency is selected, then initializing a first sequential number (M) of the plurality of flip-flops with the first state and initializing a second sequential number (M+1) of the plurality of flip-flops with the second state, wherein M is a positive non-zero integer; and clocking each of the plurality of flip-flops at the frequency of the clock signal to generate a second clock signal at a second frequency signal that is provided at the ring shift register output.

Method embodiments provide that when an even division ratio of the clock frequency is selected; the signal at the ring shift register output comprises a balanced duty cycle. When an odd division ratio of the clock frequency is selected, the signal at the ring shift register output comprises an unbalanced duty cycle having a first state to second state timing ratio of M:(M+1) clock cycles of the clock signal.

An exemplary method may further comprise that when the signal at the ring shift register output is received at a duty cycle correction block and the ring shift register output signal has a balanced duty cycle, then the ring shift register output signal is shifted to become the output clock signal. When the ring shift register output is an unbalanced duty cycle, then shifting the ring shift register output signal by 1.5 clock cycles of the clock signal and also shifting another version of the ring shift register output signal by one clock cycle of the clock signal and then performing a logical OR function on both of the shifted second frequency signals, such that the output of the logical OR function comprises the second frequency signal having a balanced duty cycle at the clock output as the output clock signal.

In other exemplary methods, a ring shift register output signal is received at a duty cycle correction block. When the ring shift register output signal comprises a balanced duty cycle, then directing the ring shift register signal to be the output clock signal. When the ring shift register output signal has an unbalanced duty cycle, then performing a logical OR function on a first version of the ring shift register signal and a second version of the ring shift register signal wherein the first and second versions of the ring shift register signals are 0.5 clock cycles, of the clock signal, out of phase. Then performing a logical OR with the first and second versions of the ring shift register signals and providing the output of the logical OR function as the output clock signal.

Yet in additional embodiments of the invention a programmable frequency divider architecture is provided that comprises a ring shift register block that comprises a plurality of flip-flops connected in series to produce a ring shift register signal output. Each of the plurality of flip-flops that are connected in series has a clock input to receive an input clock signal having an input clock frequency to be divided. The plurality of flip-flops being operatively arranged to allow connection in a ring of a selectable number of the plurality of flip-flops. Configuring a number of the plurality of flip-flops in the ring being according to a desired frequency division ratio. Furthermore, 2M of the flip-flops are configured for an even division ratio and 2M+1 of the flip-flops are configured for an odd division ratio. For example, if a desired division ratio is 6, then M is 3. Furthermore, if the desired division ratio is 5, then M is 2. These embodiments further include a duty cycle correction architecture comprising a first circuit adapted to shift the ring shift register output at the input clock signal's input clock frequency to produce a p-output signal; a second circuit, in parallel with the first circuit, adapted to shift the ring shift register output signal according to a negative input clock signal and produce a n-output signal, the negative clock signal being an inverted version of the input clock; and a logical OR circuit to logically OR the p-output signal and the n-output signal to produce and provide an output clock signal of the desired division ratio having a balanced duty cycle.

Yet additional embodiments of the programmable frequency divider architecture also include an initialization circuit adapted to initialize the selected number of the plurality of flip-flops being initialized such that, when an even division ratio is selected, M consecutive flip-flops are initialized in a first state and M consecutive flip-flops are initialized in a second state; and when an odd division ratio is selected, M consecutive flip-flops are initialized in a first state and M+1 consecutive flip-flops are initialized in a second state. When an even division ratio is selected, the second circuit is adapted to hold the n-output signal in a first state. Furthermore, when an odd division ratio is selected, the second circuit is adapted to produce the n-output signal being substantially the same as the p-output signal except shifted by one-half clock cycle of the input clock signal.

BRIEF DESCRIPTION OF THE DRAWINGS

For a more complete understanding, reference is now made to the following description taken in conjunction with the accompanying Drawings in which.

DETAILED DESCRIPTION

Embodiments of the invention provide the architecture for exemplary programmable high speed digital divider devices. A typical embodiment of an exemplary programmable high speed digital divider may be incorporated into base band transceivers or processor ICs where frequencies of different subsystems inside the circuit or chip need to be derived from one or more common high speed clock frequency sources such as a phase locked loop (PLL).

Figure 1:
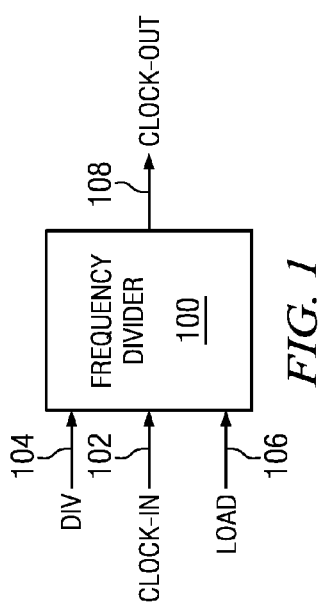
FIG. 1 depicts a basic block diagram of a frequency divider.
Figure 3:
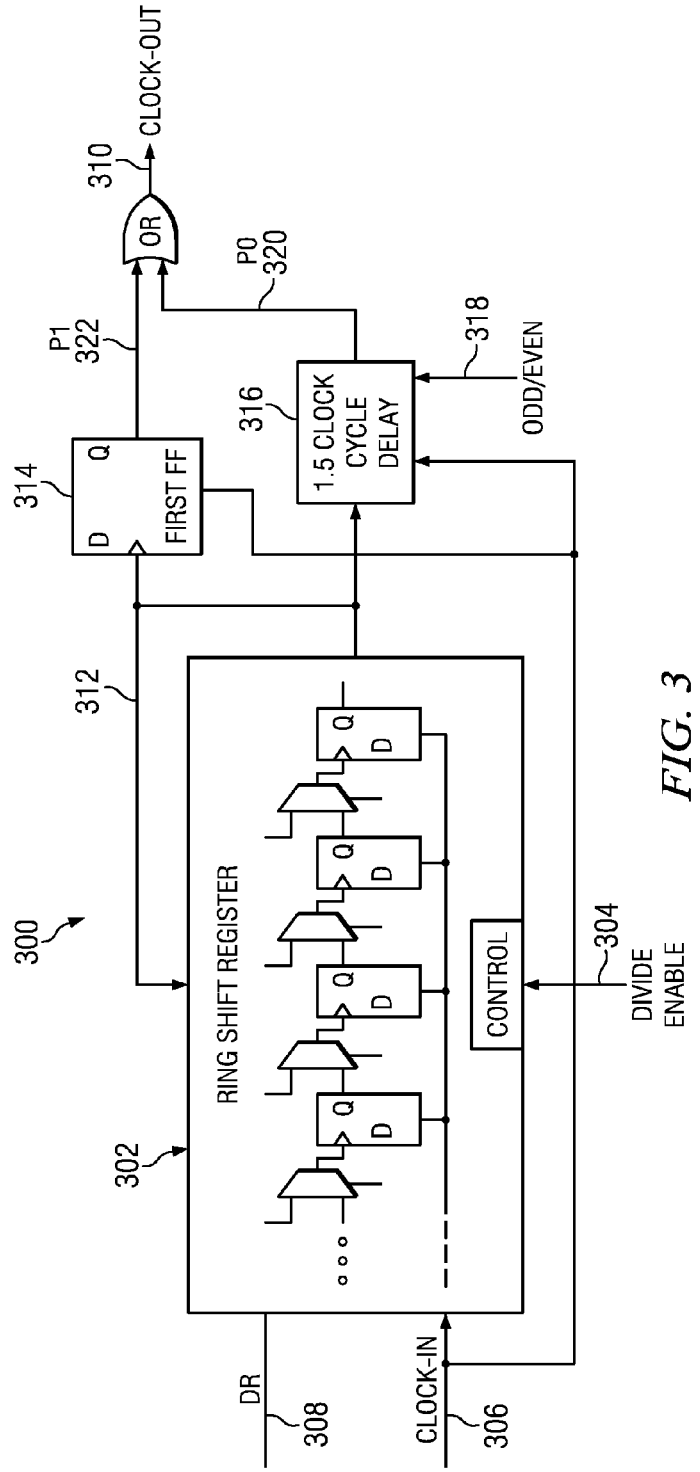
FIG. 3 is the block diagram of an exemplary programmable high speed frequency divider architecture that includes a 50% duty cycle circuit for odd or even division ratios.
Figure 2:
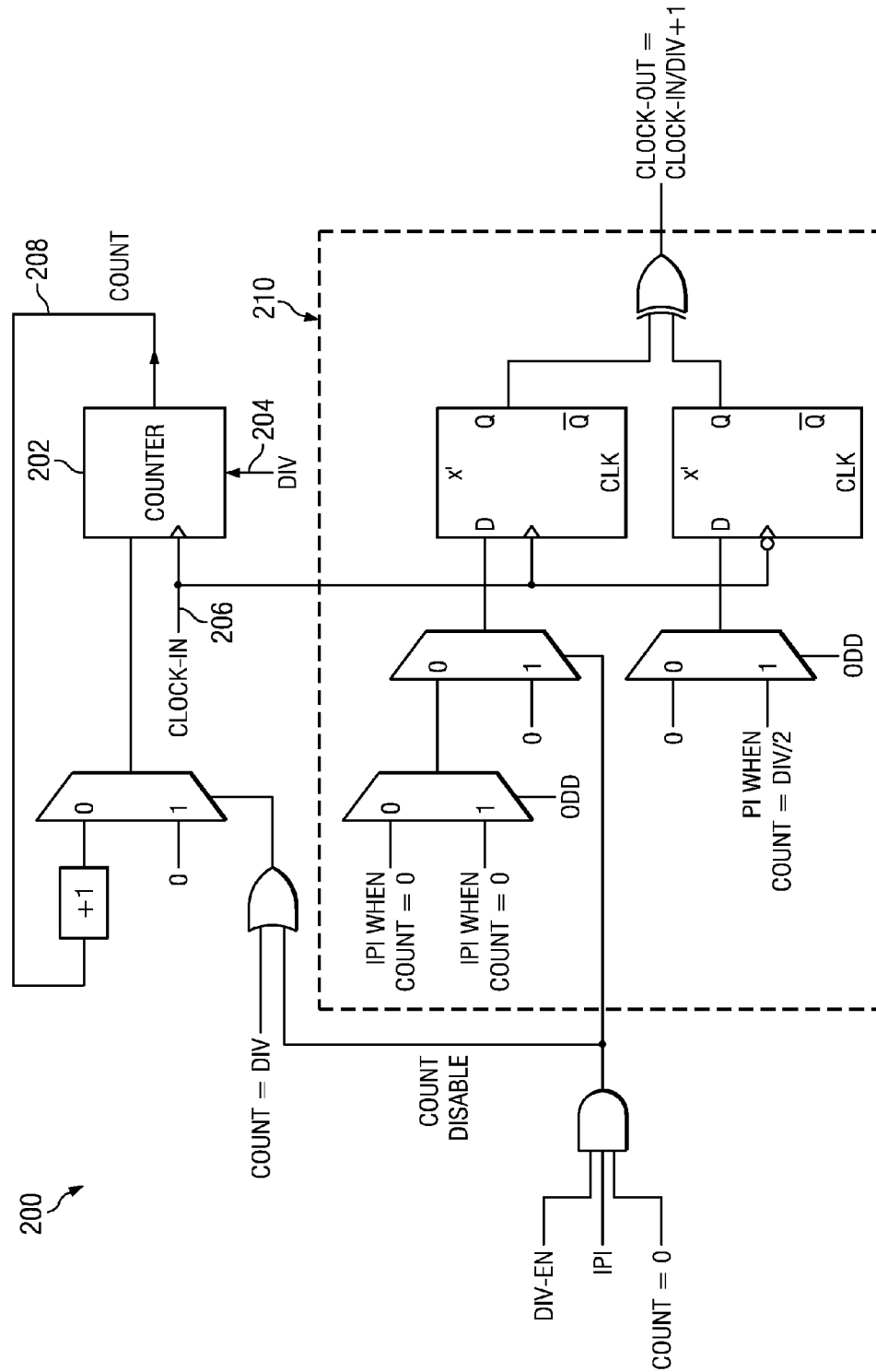
FIG. 2 depicts a block diagram of a prior art counter-style frequency divider.

Referring to FIG. 3 an exemplary programmable high speed digital divider 300 in accordance with an embodiment of the invention is shown in block diagram form. The architecture 300 comprises a ring shift register block 302, which, can be programmed to divide a given clock-in signal 306 by a selected division ratio. The division ratio is input as a DR signal, which comprises an array of bits that represent the selected division ratio to be programmed. In some embodiments, the length of the shift register within the ring shift register 302 is $2^{N+1}$, where N+1 is the number of bits that may be required to set the division ratio DR. For example, if N is equal to 2, then the number of bits available in the DR signal 308 will be N+1 or 3 bits. With 3 bits, the maximum addressable number of division ratios is $2^{N+1}$ or $2^3=8$.

Still referring to FIG. 3, when the divide enable signal 304 is enabled, embodiments of the invention will load predetermined arrays or shift sequence bits of 1s and 0s into the flip-flop (FF) devices within the ring shift register 302. In embodiments of the invention, the divisional ratio, DR, value may be odd or even positive integer values. A change in the division ratio signal (the DR signal) 308 can also cause the arrays or shift sequence bits to load without a separate divide enable signal. A person of ordinary skill in the art will recognize various ways of causing the shift sequence bits to be loaded.

To provide a 50% duty cycle clock-out signal 310 regardless of whether an odd or even division ratio is input to the DR input 308, the shift register output signal 312 is output from the ring shift register block 302 and provided to a first flip-flop (FF) 314 and to a 1½ clock cycle delay circuit 316. If the division ratio is an even division ratio, then the odd/even bit 318 will be a 0. The odd/even bit 318 is provided to the 1.5 clock cycle delay block 316 and sets the P0 signal 320 to a 0 or low. Meanwhile, the output P1 322 of the first flip-flop 314 is a one-clock cycle shifted version of the shift register output signal 312 because it is clocked by the clock signal 306. The P1 signal 322 and P0 signal 320 are ORed, which results in the clock output signal 310 looking like the P1 signal 322. In some embodiments the odd/even bit 318 can be the least significant bit (LSB) or other predetermined bit from the DR signal 308. In other embodiments the odd/even bit 318 may be provided from the control circuit associated with the ring shift register 302.

If the division ratio is odd, then the DR signal 308 will have an LSB equal to 1. The LSB of 308 or another origin may be used for the odd/even signal 318 so as to set the 1.5 clock cycle delay circuit. When the DR signal designates an odd division ratio, the 1.5 clock cycle delay circuit 316 is adapted to delay the shift register output signal 312 by ½ clock cycles and provide the delayed or shifted signal as P0 320. The shift register output signal 312 is also provided to the first FF 314 and is shifted 1 clock cycle due to the clock-in signal 306 may be used as the first FF 314 clock. As such, the P1 signal 322 is a one clock cycle shifted version of the shift register output signal 312 and the P0 signal 320 is a 1.5 clock cycle shifted version of the shift register output signal 312. In embodiments of the invention, when these 2 signals, P0 320 and P1 322, are ORed a balanced or 50% duty cycle clock-out signal 310 is provided when an odd division ratio is used to frequency divide the clock-in signal 306 frequency.

Figure 4:
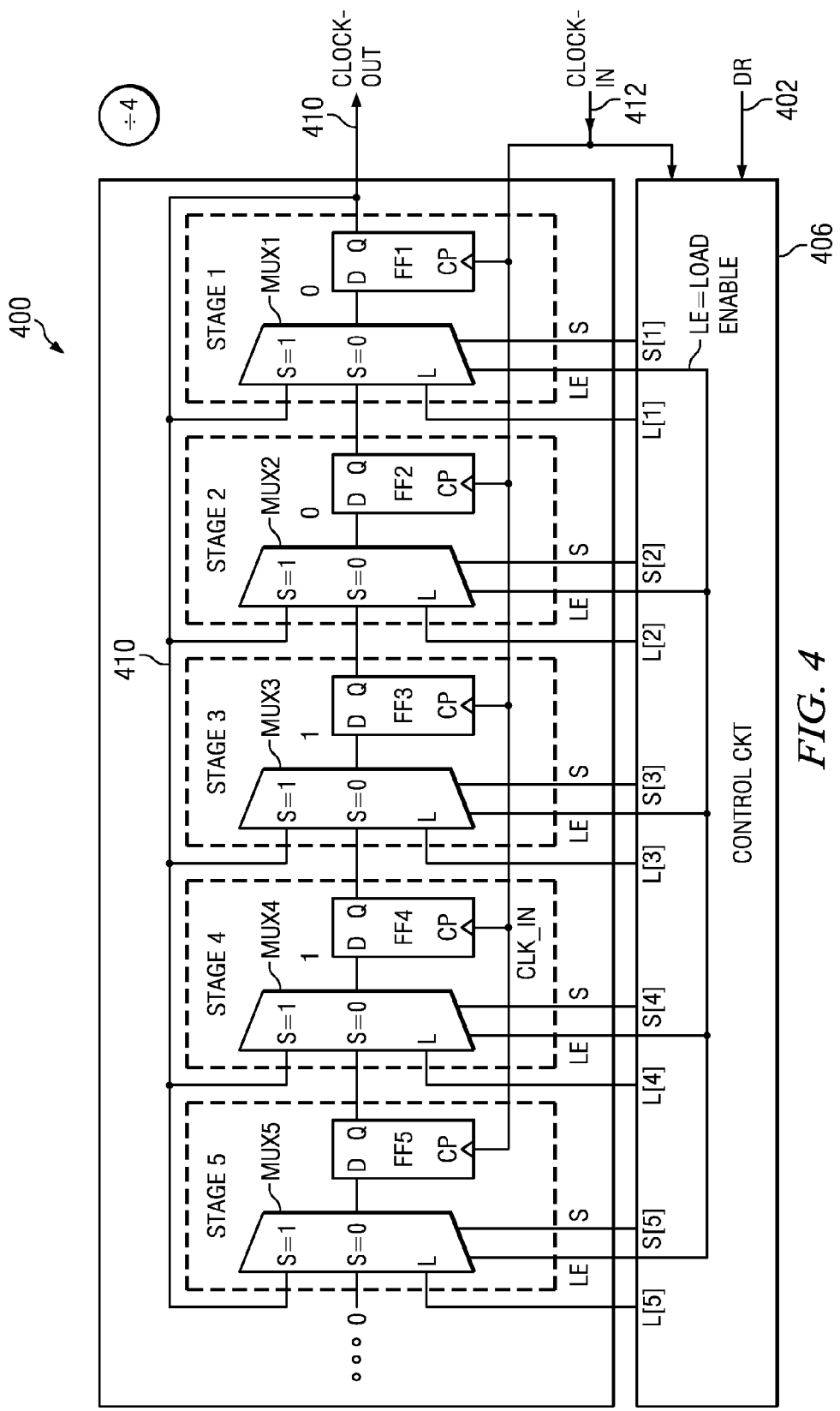
FIG. 4 is a block diagram of an exemplary high speed frequency divider architecture without a 50% duty cycle correction for odd ratios and is programmed such that the division ratio is 4.

Referring generally to FIGS. 4, 5, 7A and 7B, but focusing mainly on FIG. 4, exemplary frequency divider architecture 400, 600, 700 and 800 is shown wherein the division ratio is set by the DR input 402. In these embodiments, the division ratio DR is 4 (i.e., for example in binary 0100). When a DR signal is initialized or changes, the DR division ratio signal 402 is loaded into the Shift Sequence and MUX Decoder (SSMD) or control circuit 406. Also, a load enable signal (LE) is enabled for one clock cycle. During the load enable clock cycle the bit sequence of 0, 0, 1, 1 is loaded via the load or reset L[1] through L[4] signal lines to initialize flip-flops FF1 through FF4, respectively. At substantially the same time, the bit sequence 0, 0, 0, 1 is loaded via the S[1] through S[4] lines respectively, to set the MUXs 1, 2 and 3 to all be pass-through MUXs, which pass a signal from the Q output of one flip-flop to the D input of the next flip-flop and sets MUX 4 to be a feedback MUX, which feeds back the shift register output signal 410 through MUX 4 into the D input of FF4. The load enable signal is then disabled and the clock-in signal 412 shifts the 0011 bits of flip-flops FF1, FF2, FF3, FF4, respectively through the ring shift register thereby providing a shift register out signal 410 to be, for example, high for 2 clock-in clock cycles and low for 2 clock-in clock cycles.

Figures 6, 8:
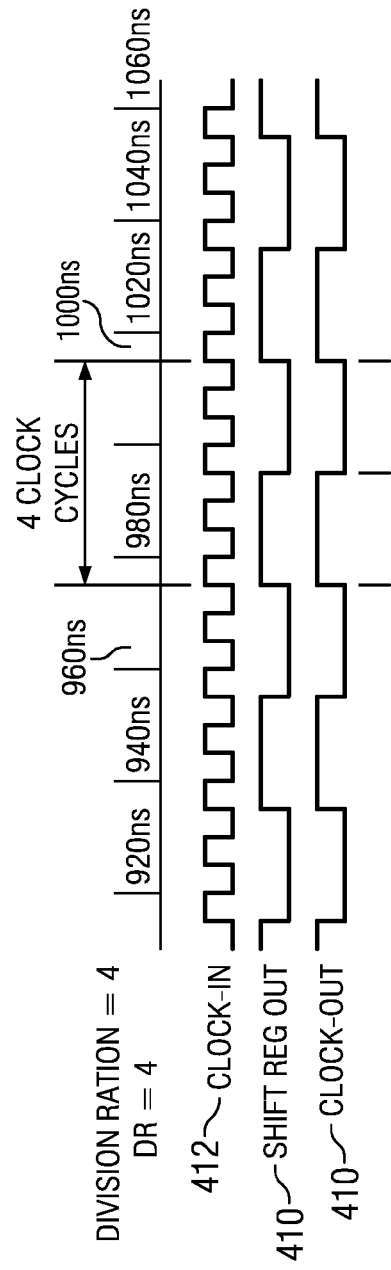
FIG. 6 is an exemplary table for configurations of the shift sequence and MUX (multiplexer) decoder in accordance with embodiments of the invention.
FIG. 8 depicts a timing diagram for the exemplary embodiment depicted in FIG. 4.

Referring to FIG. 8, one can see the clock-in signal 412. The shift register output signal and clock-out signal 410 are identical. The clock-out signal 410 has a 50% duty cycle based on the division ratio being an even positive integer and the loaded bit sequence being balanced with 0s and 1s.

Figure 5:
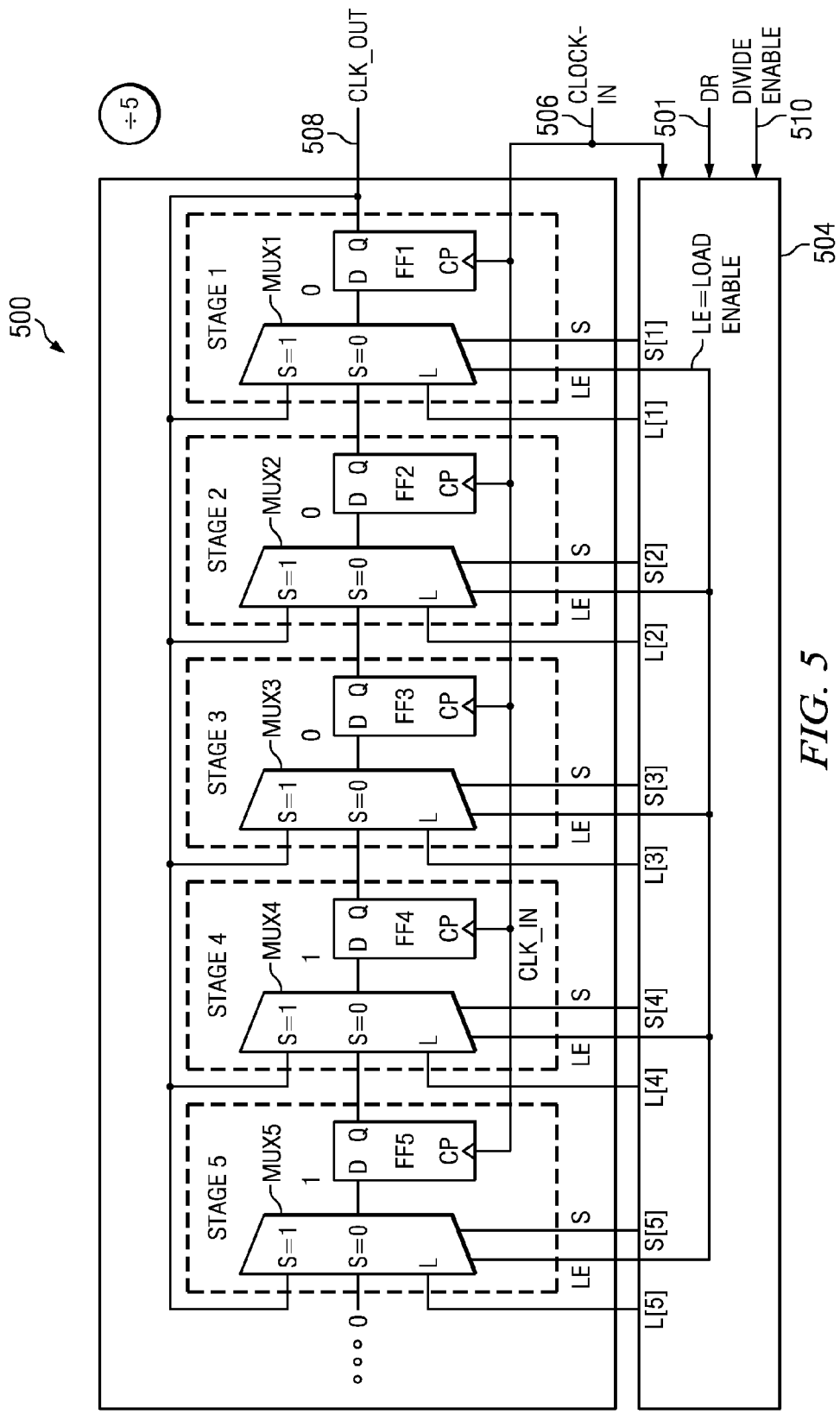
FIG. 5 is an exemplary high speed frequency divider architecture without a 50% duty cycle circuit for odd ratios that is programmed to have a division ratio of 5.

Referring now to FIGS. 5 and 6, another exemplary frequency divider architecture 500 is shown wherein the division ratio is set by the DR signal 501 to be equal to 5. In some embodiments, upon receipt of a divide enable signal, 510 FF5 and FF4 are each loaded with a logical 1 via the L[5] and L[4] signal lines. FF1, FF2 and FF3 are each loaded with a logical 0 via the L[1], L[2], and L[3] signal lines, respectively. In other embodiments, the loading can instead be caused by a change in the division ratio signal DR 501, similarly as described in FIG. 3. Loading the flip-flops sets the ring shift register such that it will create a clock-out signal 508 with a duty cycle that is as close to 50% as possible when this embodiment 500 is programmed with an odd division ratio (such as). Embodiments of the invention load the shift registers during a load enable signal such that the predetermined 1s and 0s loaded into the flip-flops will shift through the ring shift register and create a clock-out signal 508 within 1.5 clock cycles of being a 50% duty cycle clock-out signal when the division ratio is odd.

Figure 9:
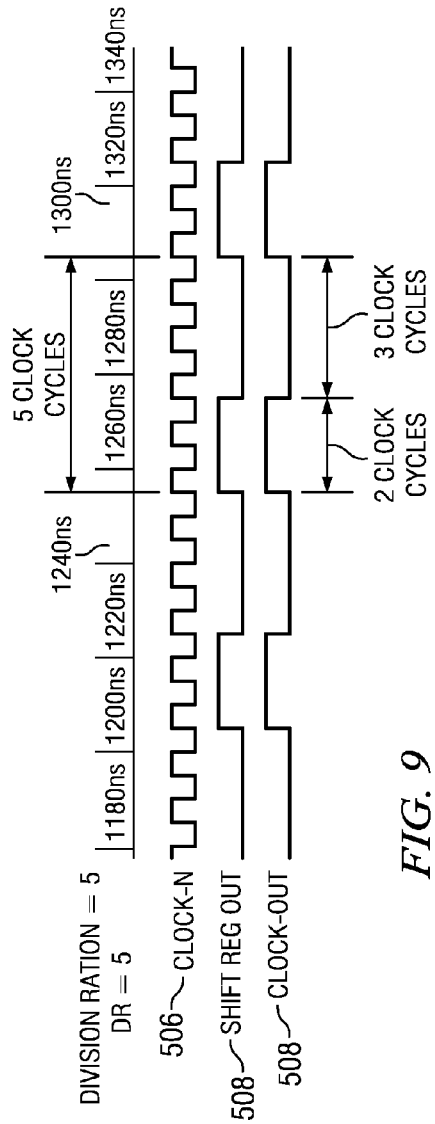
FIG. 9 depicts a timing diagram for the exemplary embodiment depicted in FIG. 5.

Furthermore, during a load enable, and referring to FIG. 6 for the division ratio 5, the MUX decode bits are loaded into MUXs 1 through 3 such that these MUXs are pass-through devices that pass the Q output from one flip-flop to the D input of the next flip-flop. The S[5] signal sets the MUX 5 to be a loopback MUX such that the shift register out signal 508 is looped back through FF5. When all of the FFs 1 through 5 and MUXs 1 through 5 have been set according to the programming for the selected division ratio, the load enable signal is disabled and the clock-in signal 506 shifts the loaded 00011 sequence about the ring shift register block 502. FIG. 9 depicts the clock-in signal 506 having, in this example, an exemplary clock frequency of 100 MHz. The shift register out signal 508 and the clock-out signal 508 are the same signal in this embodiment 500. The clock-out signal 508 is high for 2 input clock cycles and low for 3 input clock cycles.

This exemplary frequency divider architecture 500 (which is substantially the same as architecture 400) can be used when a 50% duty cycle clock-out signal is not necessary or needed by the surrounding circuitry of an exemplary device.

In embodiments of the invention, there are certain circuit elements that limit the maximum operating frequency of the circuit. Note that in the exemplary ring shift register blocks there is only 1 MUX (multiplexer) between flip-flops. No additional circuitry such as AND gates, OR gates, inverters or other circuitry is required in this part of the design to limit the maximum clock-in signal frequency that can be input into an exemplary frequency divider architecture. In this exemplary embodiment, the worst time a critical delay path is found by adding the delay time associated with timing delay from the clock input to a flip-flop (e.g., FF2) to produce the Q output of the same flip-flop, FF2, plus the delay through a MUX (e.g., MUX 1), plus the set-up time of the next flip-flop (e.g., FF1). For example with CMOS 040 technology, it can be estimated that this worst critical delay time totals to about 500 picoseconds plus or minus about 10%. Using this estimated worst critical delay time of 500 picoseconds as a minimum clock cycle time, then it follows that the maximum operating clock in frequency for an exemplary embodiment using CMOS 040 technology is about 2 GHz, plus or minus about 10%. Such a maximum operating frequency can be calculated similarly for any circuit technology used in exemplary high speed frequency divider architecture. Furthermore, unlike prior art counter-style frequency dividers, the delay in exemplary high speed divider architecture through each stage or MUX combination of an exemplary ring shift register is not cumulative. It follows that whether there are only a couple FFs or 1024 FFs in an exemplary high speed frequency divider, the critical timing delay that limits the overall speed of an exemplary frequency divider's functionality does not increase with the addition of FFs or with the maximum division ratio that exemplary high speed frequency divider architecture can handle. In other words, the maximum clock-input signal frequency that can be input and used in an exemplary embodiment does not depend on the number of bits used in the DR signal to select the division ratio nor does it depend on the number of flip-flops or the length of an exemplary ring shift register block.

Referring momentarily to FIG. 6, a chart is provided that indicates the predetermined bits that are to be loaded into shift registers for the selected division ratio and the predetermined bits that should be loaded into the MUXs to set the ring shift register length for the selected division ratio. The MUX decode sets a MUX to be a loop-back MUX when S[x] is set to, for example, a 1 state and further sets a MUX to be a feed-through MUX when S[x] is set to, for example, a 0 state during a load enable (LE). Furthermore, during a load enable (LE), the flip-flops are loaded with a predetermined bit sequence according to the selected division ratio being programmed. For example, when the division ratio, DR, is selected to be 4, the S[4] sets MUX 4 as the loopback MUX and MUXs 3, 2 and 1 are set as feed through MUXs via S[3], S[2] and S[1]. Furthermore, the sequence of 0, 0, 1, 1 is loaded into FF1, FF2, FF3, and FF4, respectively, when a division ratio is set to 4.

Figure 7A:
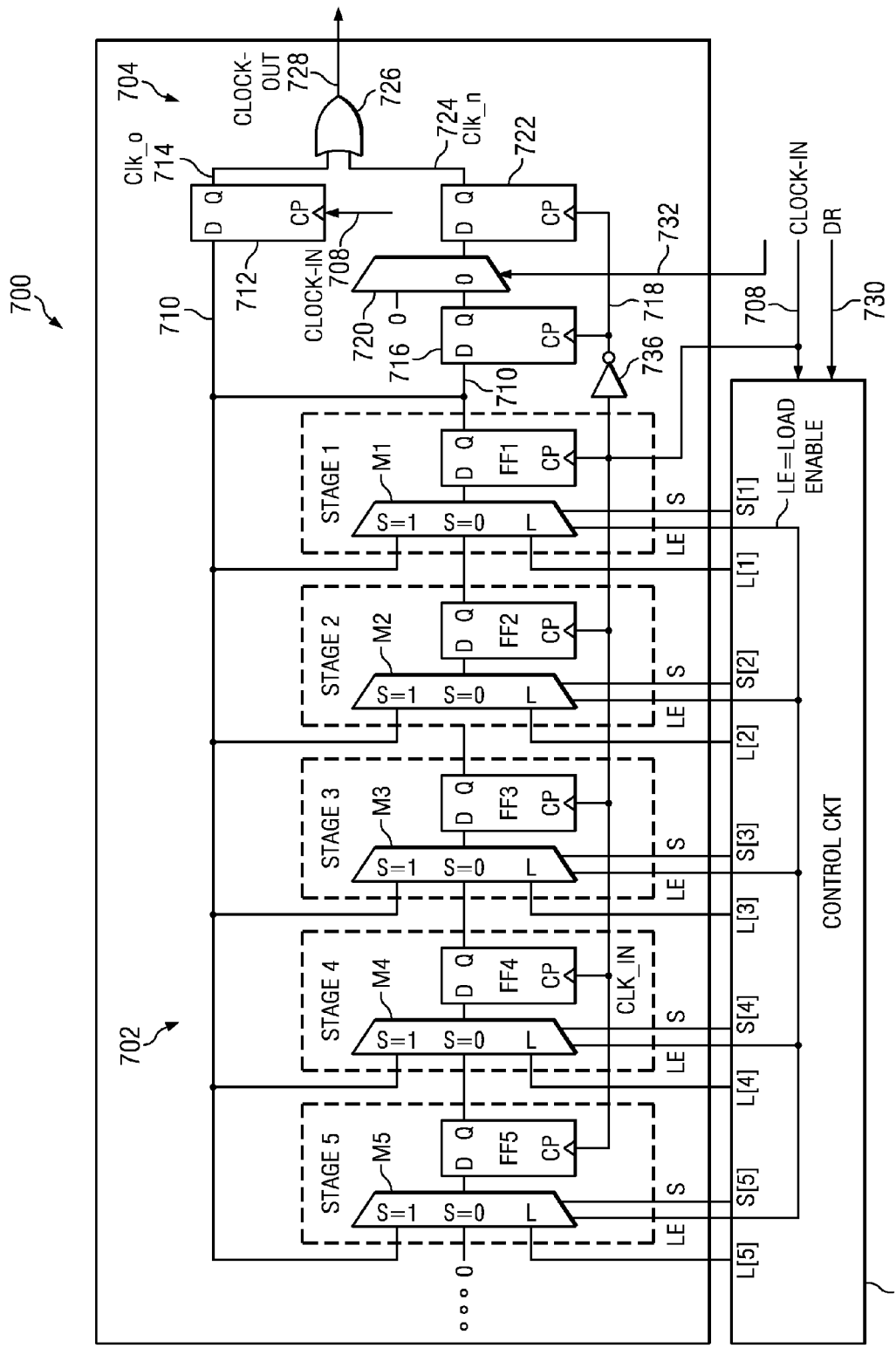
FIG. 7A is a high speed frequency divider architecture that includes a 50% duty cycle correction circuit for odd ratios in accordance with embodiments of the invention.
Figure 10:
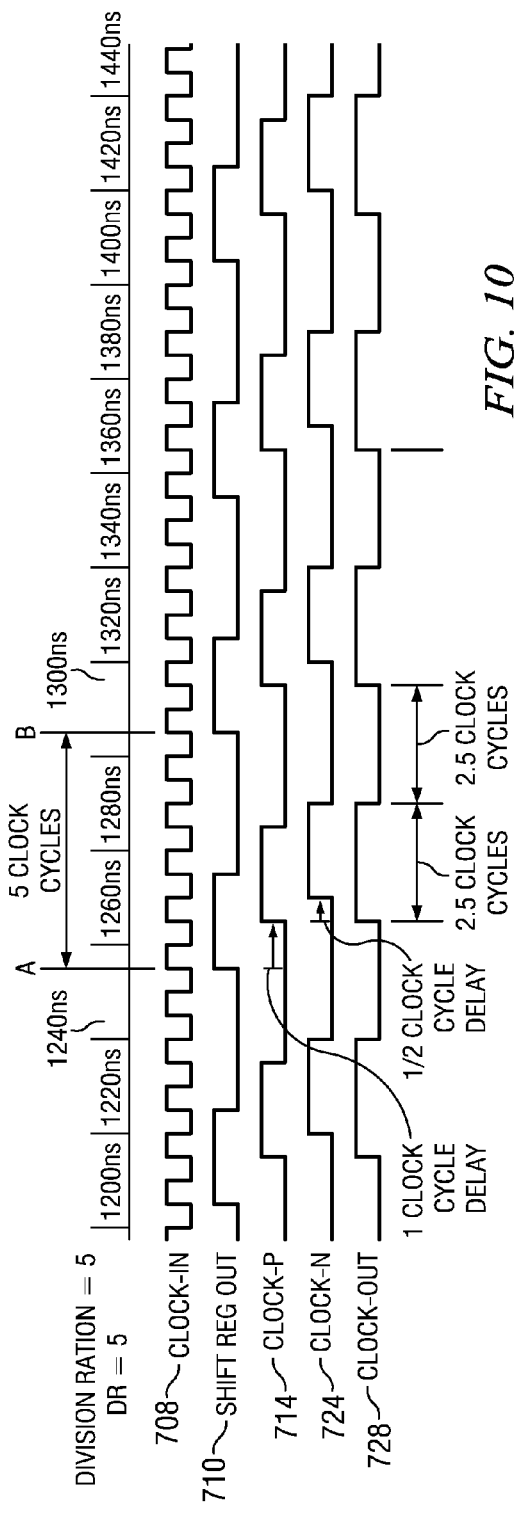
FIG. 10 depicts an exemplary timing diagram for the exemplary embodiment depicted in FIG. 7A.

Referring to FIGS. 7A and 10, a block diagram of exemplary frequency divider architecture 700 is shown having an exemplary ring shift register block 702, a 50% duty cycle adjustment circuit 704 and a shift sequence and MUX decoder (SSMD) block or control circuit 706. In FIG. 10 a signal timing chart for various signals in the frequency divider architecture 700 is provided. The input clock 708 is shown in FIG. 10 to have a clock frequency of 100 MHz. In this embodiment the DR signal, which is an array of bits, is set such that the selected division ratio is equal to 5. For example, the DR signal 730 may be an array of 4 bits being 0101.

The shift register output signal 710 is shown in both FIGS. 7A and 10. In FIG. 10, five clock cycles of the clock-in signal 708 are indicated between the timing marks A and B. Between the same timing marks, A and B, the shift register output signal 710 is high for 2 clock cycles and then low for 3 clock cycles after which the pattern repeats. Thus, the shift register output signal 710 does not have a 50% duty cycle, but instead comprises a ⅖ duty cycle. Exemplary embodiments are adapted to adjust or correct the duty cycle of odd division ratios (i.e., 5, 7, 9, . . . , 1203 . . . ). To adjust or correct the duty cycle to a 50% duty cycle exemplary embodiments use an exemplary duty cycle adjustment circuit 704. The shift register output signal 710 is provided to the d-input of flip-flop 712, which is clocked by the clock-input signal 708. As a result the output of the flip-flop 712, called clock-P 714, is shifted or delayed one clock cycle with respect to the shift register output signal 710. Meanwhile, the shift register output signal 710 is also provided to the d-input of FF 716, which is clocked by an inverted clock-input signal 718. The inverted clock-input signal 718 is created by inverting the clock-in signal 708 with an inverter 736. The inverted clock input signal 718 effectively clocks the FF 716 on a negative edge of the clock-in signal 708, which shifts the shift register output signal 710 by half a clock cycle. The Q output of FF 716 is passed through the MUX 720 when the least significant bit 732 of the DR signal bit array is a 1, which will occur for any odd division ratio. After being passed through the MUX 720, the signal is then shifted or delayed by 1 clock cycle in FF 722, which is also clocked by the inverted clock-in signal 718. The result is that the output of FF 722, which is called clock-N 724, is shifted a total of 1½ cycles (i.e., ½ clock cycle with respect to clock-P 714 and 1½ with respect to the shift register output signal 710.)

When the clock-P 714 and the clock-N 724 signals are ORed at the OR gate 726, one can see from FIG. 10 that the result is a 50% duty cycle output signal 728 that is high and low for 2.5 clock-in clock cycles respectively. Thus, the embodiment provides a 50% duty cycle clock output for odd division ratios. When any odd division ratio is programmed into an exemplary high speed frequency divider architecture the shift sequence bits that are loaded into the flip-flops during load enable always create a repeating shift register output signal pattern that is within 1.5 clock cycles of being a 50% duty cycle signal. As such, an exemplary duty cycle adjustment circuit 704 operates similarly for all odd division ratios programmed into an exemplary ring shift register.

Still referring to FIG. 7A, when the division ratio DR is set to an even division ratio, the least significant bit (LSB) 732 of the DR bit array input 730 will always be a "0". In some embodiments, the DR signal input 730 provides the odd/even signal 732 to the MUX 720 such that the output of the MUX 720 does not pass through the signal from the output of flip-flop 716, but instead outputs a 0 to the input of flip-flop 722. In other embodiments the odd/even signal 732 may be provided from another signal source such as the control circuit 706, or from a MSB or other bit of a predetermined signal. The "0" propagates through flip-flop 722 resulting in the clock-N signal 724 being in a constant "0" state. When the clock-N signal 728 and the clock-P signal 714 are ORed at the OR gate 726, the clock-out signal 724 will always be equal to the clock-P signal 714. The clock-P signal 714 is the same as the shift register out signal 710, but shifted by 1 clock cycle. Thus, the clock out signal 728 has a 50% duty cycle signal. As such, embodiments of the invention provide a clock out signal equal to the clock-in signal frequency divided by the division ratio and a 50% duty cycle regardless of whether the programmed division ratio is an odd or even positive integer.

Still referring to FIG. 7A, an estimated maximum clock-in signal frequency can be determined based for an exemplary high speed frequency divider architecture based on the worst timing critical delay path. The worst timing critical delay path occurs in this exemplary frequency divider architecture 700 during a programmed odd division ratio because the clock input signal 708 is inverted by the inverter 736 to create a half clock cycle delayed-inverter clock-in signal 718. Therefore, the critical circuit timing delay path of an exemplary circuit is between FF1 and FF 716 due to the inversion of the clock-in signal by inverter 736. To calculate the worst case critical timing delay, one adds the timing delay due to the clock-in signal 708 at FF1 to the Q out of FF1 plus the set-up time of FF 716 which totals about 260 ps +/− about 10% for the critical worse case timing delay when using CMOS040 technology. The 260 ps is multiplied by 2 because the maximum time before FF 716 is clocked has been shortened to half of a clock cycle due to the inverter 736. Therefore, 260 ps times 2 equals 520 ps +/− about 10% as the worst timing in the critical delay path for an odd division ratio. If one assumes that 520 ps is the smallest clock cycle then 1/520 ps provides the estimate of the maximum clock-in frequency 708 as being about 1.92 GHz +/− about 10% for an embodiment that provides a 50% duty cycle clock-out signal when performing a programmed odd division ratio. What is important to understand is that the critical time delay path is not cumulative as the division ratio increases in embodiments of the invention. That is, exemplary high speed frequency divider architectures can be programmed or designed to perform substantially any division ratio (odd or even) with a clock-in signal frequency in a maximum frequency range (e.g. about 1.8 GHz to about 2.3 GHz based on theoretical CMOS 040 maximum signal delays and flip-flop setup values) regardless of the number of flip-flop "stages" in the ring shift register, the division ratio (DR) selected or the number N used to define the number of bits to be used in the DR signal. Note that as CMOS and integrated circuit and chip manufacturing technology advance, the critical delay time of exemplary embodiments will most likely decrease and thereby increase the maximum allowable clock-input signal frequency of exemplary frequency divider circuits.

Another way of understanding FIG. 7A is to view the exemplary ring shift register block 702 as a set of shift register stages {S_i} connected in series. FIG. 7A depicts 5 shift register stages, S_1 through S_5. Each stage, S_i, of the shift register stages comprises a stage multiplexer M_i and a stage flip-flop FF_i. An output, MO_i, of each stage multiplexer, M_i, is coupled to a flip-flop input, FFI_i, of the corresponding stage flip-flop, FF_i. A flip-flop output, FFO_i of each stage flip-flop, FF_i, coupled to a first multiplexer input, MI1_i−1 of a stage multiplexer M_i−1 in an immediately following stage S_i−1. The flip-flop output, FFO_1 of flip-flop FF_1 in stage S_1 of the shift register stages is coupled to a second input, MI2_i, of each stage multiplexer, M_i. Also, each stage flip-flop, FF_i is configured to be clocked and positive edge triggered by the input clock signal such that the first flip-flop output, FFO_1, of the first flip-flop, FF_1, in stage S_1 of the shift register is the shift register output signal 710

FIG. 7A depicts each shift register stage, S_i, having its multiplexer, M_i, coupled to the control circuit 706. Each stage multiplexer M_i is adapted to receive from the control circuit 706 a selection signal S[i] for selecting the stage's multiplexer output signal, MO_i, to correspond to either the first stage multiplexer input signal, MI1_i, or the previous stage's flip-flop signal output, FFO_i−1. The selection signal S[i] depends on the frequency division ratio. It should be understood, that the frequency division ratio is related to the input clock signal frequency divided by the output clock signal frequency. In other words, the input clock frequency has a first clock cycle period, while the output clock frequency has a second clock cycle period. The second clock cycle period is a programmable multiple, A, of the first clock cycle period of the input clock frequency. Furthermore, FIG. 7A depicts each stage, S_i, wherein the stage multiplexer, M_i, is coupled to the control circuit 706 to receive a load signal L[i], the load signal L[i] depends on the programmable multiple A, wherein A is a positive integer.

When the programmable multiple value, A, is even (i.e., the input clock frequency is being divided by an even number or, in other words, the input clock cycle period is being multiplied by a selected even positive integer to produce the output clock frequency and output clock cycle period), the load or reset values, L[i] of the stages S_(A/2) to S_1 are loaded with signals corresponding to a logical value 0, and the load or reset values L[i] of stages S_(A/2) to S_A are loaded with signals corresponding to the logical value 1. Alternatively, when the programmable multiple value, A, is odd (i.e., the input clock frequency is being divided by an odd number or, in other words, the input clock cycle period is being multiplied by a selected odd positive integer to produce an output clock frequency and output clock cycle period), the load or reset values L[i] of stages S (trunc(A/2)+1) to S_1 are loaded with signals corresponding to a logical value 0; And, the load or reset values L[i] of stages S (trunc(A/2)+2 to S_A are loaded with signals corresponding to the logical value 1. Meanwhile, the selection signal S[i] of stages S_i selects the second input MI2_i for i=M_A, and selects the first input MI1_i for i=M_A−1 . . . to . . . , M_1.

Figure 7B:
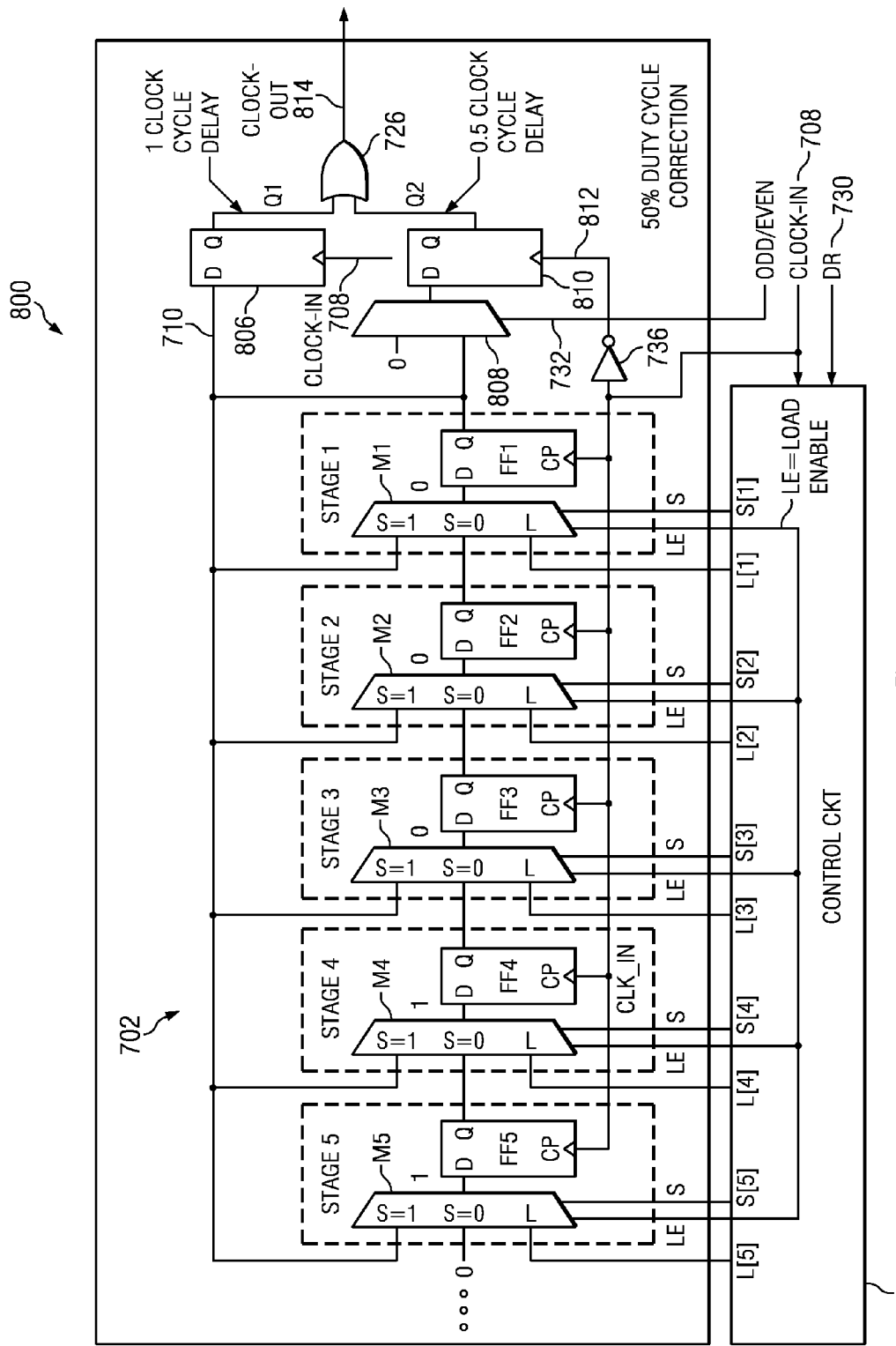
FIG. 7B is a block diagram of another exemplary high speed frequency divider architecture having a 50% duty cycle correction circuit.

Referring now to FIG. 7B, an additional exemplary block diagram of a high speed frequency divider architecture in accordance with an embodiment of the invention is provided. This frequency divider architecture 800 comprises a substantially similar ring shift register block 702 and SSMD or control circuit block 706 as depicted in FIG. 7A.

For an odd division ratio the shift sequence and MUX decode bits (see FIG. 6) that are loaded during the load enable can be the same as described in the frequency divider architecture of FIG. 7A. The shift register output signal 710 is provided to flip-flop 806, which is clocked by the clock in signal 708. The output of FF 806, called signal Q1 is a 1 clock cycle shifted version of the shift register output signal 710. The shift register output signal 710 is also provided to MUX 808. MUX 808 receives the least significant bit (LSB) 732 of the DR bit array 730, which for an odd division ration will also be a 1. When MUX 808 receives the LSB signal 732 as a 1, it passes the shift register output signal 710 through to the input of flip-flop 810. FF 810 is clocked by an inverted input clock signal 812, which is inverted by inverter 726. The Q output of FF 810, called Q2, is a half clock cycle shifted version of the shift register output signal 710.

Although a signal diagram is not provided for this embodiment, one of ordinary skill in the art would understand that ORing signal Q1 with signal Q2 at ORgate 726 will produce a 50% duty cycle clock out signal 814.

When an even division ratio is programmed into exemplary frequency divider architecture 800, the LSB 732 of the DR signal bit array 730 will always be a 0. Thus, the MUX 808 will only output a 0, which will propagate through FF 810 to the ORgate 726. Thus, when Q2 is ORed with signal Q1 the clock output 814 will be equal to signal Q1, which is a 1 clock cycle shifted version of the shift register output signal 710 and will also have a 50% duty cycle. As such, the exemplary high speed frequency divider architecture 800 provides a frequency divider that outputs a 50% duty cycle clock-out signal regardless of whether an even or odd division ratio has been programmed therein. It should be noted that the worst time in critical delay path for this embodiment 800 is slightly larger than the embodiment 700 of FIG. 7A due to the placement of MUX 808 between FF 1 and FF 810. The result limits this embodiment to a slightly lower maximum clock input signal frequency than that of embodiment 700. Regardless, this exemplary embodiment 800 uses 1 less flip-flop than embodiment 700.

It will be appreciated by those skilled in the art having the benefit of this disclosure that this programmable high-speed frequency divider architecture provides a programmable high speed frequency divider that provides a 50% duty cycle signal output regardless of whether an odd or even division ratio is programmed into the exemplary frequency divider circuit. Furthermore, when an odd division ratio is needed, loading the flip-flops in an exemplary ring shift register such that the ring shift register output signal is within 1.5 clock input clock signal cycles of being a 50% duty cycle signal provides the ability for an exemplary duty cycle adjustment circuit to correct the duty cycle to be a 50% duty cycle at the clock output of an exemplary frequency divider architecture. Furthermore, various embodiments provide high speed frequency divider architectures that provide a 50% duty cycle clock output when even division ratios are programmed therein. And, provides clock outputs that are within 1.5 clock-in signal clock cycles of being a 50% duty cycle signal for odd division ratios. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the underlying design and scope hereof, as defined by the following claims. Thus, it is intended that the following claims be interpreted to embrace all such further modifications, changes, rearrangements, substitutions, alternatives, design choices, and embodiments.

What is claimed is:

1. A frequency divider circuit adapted to receive an input clock signal having a first period and adapted to provide an output clock signal having a second period that is a programmable multiple, A, of the first period, the frequency divider circuit comprising:
    a shift register circuit adapted to receive the input clock signal, the shift register circuit provides a first output signal; and
    a duty cycle compensation circuit configured to receive the first output signal, the duty cycle compensation circuit comprises:
        a first delay circuit configured to provide a second output signal, the second output signal having a substantially constant amplitude when multiple A is even, the second output signal corresponding to the first output signal delayed by a first delay when multiple A is odd;
        a second delay circuit configured to provide a third output signal, the third output signal corresponding to the first output signal delayed by a second delay that is substantially one-half an input clock signal cycle less than the first delay; and
        an OR circuit having a first input adapted to receive the second output signal and a second input adapted to receive the third output signal, the OR circuit provides the output clock signal as a result performing an OR function on the second and third output signals.

2. The frequency divider circuit according to claim 1, wherein the shift register circuit comprises:
    a set of shift register stages {S_i} connected in series, each stage S_i comprising a stage multiplexer M_i and a stage flip-flop F_i, an output MO_i of each stage multiplexer coupled to an input FFI_i of the corresponding stage flip-flop FF_i, an output FFO_i of each stage flip-flop FF_i coupled to a first input MI1_i−1 of a stage multiplexer M_i−1 in an immediately following stage S_i−1, the output FO_1 of flip-flop FF_1 in stage S_1 of the shift register being coupled to a second input MI2_i of each stage multiplexer M_i; each stage flip-flop FF_i configured to be clocked and positive edge triggered by the input clock signal, the output FFO_1 of flip-flop FF_1 in stage S_1 of the shift register being the first output signal.

3. The frequency divider circuit according to claim 2, wherein each stage multiplexer M_i is coupled to a control circuit, each stage multiplexer M_i is adapted to receive from the control circuit a selection signal S[i] for selecting between the stage multiplexer output signal MO_i corresponding to the first stage flip-flip output, FFO_1, or a previous stage's flip-flop output, FFO_i−1, the selection signal S[i] depending on the multiple A.

4. The frequency divider circuit according to claim 2, wherein each stage multiplexer M_i is coupled to a control circuit, each stage multiplexer M_i is adapted to receive a load signal for loading the stage multiplexer M_i with a load value L[i], the load value L[i] depending on the multiple A.

5. The frequency divider circuit according to claim 2, wherein the shift register circuit is configured to provide the first output signal with a duty cycle that is substantially 50% when the multiple A is even.

6. The frequency divider circuit according to claim 2, further comprising the control circuit.

7. The frequency divider circuit according to claim 2, wherein:
    when the multiple value A is even, the reset value of stages S_(A/2) to S_1 are loaded with signals corresponding to logical value 0, the reset value of stages S_(A/2)+1 to S_A are loaded with signals corresponding to logical value 1; and
    when the multiple value A is odd, the reset value of stages S (trunc(A/2)+1) to S_1 are loaded with signals corresponding to logical value 0, and the reset value of stages S_(trunc(A/2)+2) to S_A are loaded with signals corresponding to logical value 1; and the selection signal S[i] of stage S_i selects the second input MI2_i for i=M_A, and selects the first input MI1_i for i=M_A−1, ..., M_1.

8. The frequency divider circuit according to claim 1 wherein the first delay circuit comprises:
    a first delay circuit flip-flop clocked by the input clock signal and changing its output value on a negative edge of the input clock signal, an input of the first delay circuit flip-flop being coupled to the first output signal;
    a delay circuit multiplexer comprising:
        a first input of the delay circuit multiplexer coupled to an output of the first delay circuit flip-flop; and
        a second input of the delay circuit multiplexer coupled to receive a signal having a substantially constant amplitude; and
        the delay circuit multiplexer configured to receive a selection signal from the control circuit for selecting between an output signal of the delay circuit multiplexer corresponding to (a) the first input of the delay circuit multiplexer or (b) the second input of the delay circuit multiplexer, the selection signal depending on whether the multiple A is even or odd; and
    a second first delay circuit flip-flop clocked by the input clock signal and changing its output value on the negative edge of the input clock signal, an input signal of the second first delay circuit flip-flop being the output signal of the first delay circuit multiplexer, an output of the second first delay circuit flip-flop provides the second output signal.

9. The frequency divider circuit according to claim 8, wherein the signal having substantially constant amplitude is substantially zero.

10. The frequency divider circuit according to claim 1, wherein the second delay is provided at least in part by a positive edge triggered flip-flop.

11. A mobile communication unit comprising a frequency divider in accordance with claim 1.

12. A method for frequency dividing an input clock signal having a first cycle period to provide an output clock signal having a second cycle period that is a programmable multiple, A, of the first cycle period, the method comprising:
    receiving, by a shift register circuit, the input clock signal and producing a first output signal;
    receiving, by a duty cycle compensation circuit, the first output signal;
    producing, by the duty cycle compensation circuit, a second output signal having a substantially constant amplitude when multiple A is even and producing the second output signal corresponding to the first output signal delayed by a first delay when multiple A is odd;
    producing, by the duty cycle compensation circuit, a third output signal corresponding to the first output signal delayed by a second delay that is substantially one-half an input clock signal cycle period less than the first delay; and
    logically ORing the second output signal with the third output signal to produce the output clock signal.

13. The method of claim 12, wherein a duty cycle of the first output signal is 50% when the multiple A is even.

14. The method of claim 12, wherein the duty cycle compensation circuit comprises a first delay circuit comprising a first delay circuit flip-flop, a delay circuit multiplexer, and a second delay circuit flip-flop, wherein the method further comprises:
    receiving, by a first delay circuit flip-flop, the first output signal;
    clocking the first delay circuit flip-flop with the input clock signal and changing a first delay circuit flip-flop output value on a negative edge of the input clock signal;
    providing the first delay circuit flip-flop output to a first input of a delay circuit multiplexer;
    providing a signal having a substantially constant amplitude to a second input of the delay circuit multiplexer;
    providing a selection signal to the delay circuit multiplexer adapted to produce a delay circuit multiplexer output corresponding to (a) the first delay circuit flip flop input or (b) the substantially constant amplitude, wherein delay circuit multiplexer output depends on whether the multiple A is even or odd; and
    receiving, by the second delay circuit flip-flop, the delay circuit multiplexer output; and
    clocking the second delay circuit flip-flop with the input clock signal and changing a second delay circuit flip-flop output value on the negative edge of the input clock signal to provide the second output signal.

15. The method of claim 12, wherein the duty cycle compensation circuit comprises a second delay circuit comprising a third delay circuit flip-flop, the method further comprising:
    receiving the first output signal at an input of the third delay circuit flip-flop and triggering a third delay circuit flip-flop output on a positive edge of the input clock signal, the third delay circuit flip-flop output being the third output signal.

16. A programmable frequency divider circuit comprising:
    a ring shift register adapted to be initialized with a bit pattern and an effective ring length, the ring shift register adapted to receive an input clock signal having a first clock frequency such that the ring shift register shifts the bit pattern through the ring shift register at the first clock frequency and such that the bit pattern repeats at a second frequency to produce a ring shift register output signal having the second clock frequency;
    an control block adapted to initialize the shift sequence bit pattern and the effective ring length of the ring shift register upon receipt of a division ratio signal; and
    a duty cycle correction block adapted to produce a frequency divider output clock signal at the second frequency and comprises a balanced duty cycle by logically ORing a first delayed ring shift register output signal and a clock-N signal, which is held at a first state when the second frequency is an even division ratio of the first frequency; and to logically OR the first delayed ring shift register output and the clock-N signal, which corresponds to a second delayed ring shift register output signal when the second frequency is an odd division ratio of the first frequency.

17. The programmable frequency divider circuit of claim 16, wherein the first delayed ring shift register output is delayed by a predetermined amount and the second delayed ring shift register is delayed by one-half clock cycle of the first clock frequency more than the first delayed ring shift register output when the second frequency is and odd division ratio of the first frequency.

* * * * *